United States Patent
Kang (10) Patent No.: US 10,411,372 B2
(45) Date of Patent: Sep. 10, 2019

(54) DIN LATCH MECHANISM

(71) Applicant: Rockwell Automation Asia Pacific Business Ctr. Pte., Ltd., Singapore (SG)

(72) Inventor: Soon Seng Kang, Singapore (SG)

(73) Assignee: Rockwell Automation Asia Pacific Business Ctr. Pte., Ltd., Singapore (SG)

( * ) Notice: Subject to any disclaimer, the term of this patent is extended or adjusted under 35 U.S.C. 154(b) by 80 days.

(21) Appl. No.: 15/208,680

(22) Filed: Jul. 13, 2016

(65) Prior Publication Data

US 2018/0020564 A1    Jan. 18, 2018

(51) Int. Cl.
*H05K 5/00* (2006.01)
*H01R 9/26* (2006.01)
*H05K 7/14* (2006.01)
*H02B 1/052* (2006.01)

(52) U.S. Cl.
CPC ......... *H01R 9/2608* (2013.01); *H02B 1/0526* (2013.01); *H05K 7/1474* (2013.01)

(58) Field of Classification Search
CPC .... H05K 7/1401; H05K 7/1474; H05K 7/183; H05K 5/0217; H05K 5/0221; H02B 1/052; H01R 9/26; H01R 4/24; H01R 4/66

See application file for complete search history.

(56) References Cited

U.S. PATENT DOCUMENTS

| | | | | |
|---|---|---|---|---|
| 4,671,697 A * | 6/1987 | Ando | ............... | H02B 1/052 403/325 |
| 4,900,275 A * | 2/1990 | Fasano | ............... | H02B 1/052 439/716 |
| 5,103,373 A * | 4/1992 | Rusch | ............... | H02B 1/052 361/605 |
| 5,316,164 A * | 5/1994 | Feuerlein | ............... | H02B 1/052 220/3.2 |
| 5,904,592 A | 5/1999 | Baran et al. | | |
| 6,224,429 B1 * | 5/2001 | Bernhards | ............... | H01R 9/2608 439/709 |
| 6,293,820 B1 * | 9/2001 | Bechaz | ............... | H02B 1/052 439/532 |
| 6,418,027 B1 | 7/2002 | Suzuki et al. | | |
| 6,431,909 B1 | 8/2002 | Nolden et al. | | |
| 7,059,898 B2 | 6/2006 | Barile | | |

(Continued)

OTHER PUBLICATIONS

Beckhoff Fieldbus Components—Documentation for Terminal Modules (KM10X2), Ver. 2.0.0 dated Mar. 21, 2012 (3 pages).

(Continued)

*Primary Examiner* — Hoa C Nguyen
*Assistant Examiner* — Christopher L Augustin
(74) *Attorney, Agent, or Firm* — Fay Sharpe LLP (57) ABSTRACT

An electronics module having a latch assembly including first and second reciprocating latch portions adapted to engage respective first and second opposite edges of a mounting rail. Each of the latch portions includes a locking tab, the locking tabs movable away from each other from a latched position to an unlatched position, the first and second latch portions being coupled together for reciprocating motion, at least one of said latch portions including an actuator portion extending from the housing for manual actuation of the latch assembly between the latch and unlatched positions.

17 Claims, 13 Drawing Sheets

(56) References Cited

U.S. PATENT DOCUMENTS

| | | | |
|---|---|---|---|
| 7,488,913 B1 * | 2/2009 | Durham | H02B 1/052 200/400 |
| 7,980,891 B2 | 7/2011 | Molnar | |
| 8,066,239 B2 | 11/2011 | Molnar et al. | |
| 8,670,221 B2 * | 3/2014 | Gillespie | H01R 9/2433 361/118 |
| 8,851,529 B2 * | 10/2014 | Chiang | H05K 5/0221 292/117 |
| 9,276,333 B1 * | 3/2016 | Wu | H01R 9/2608 |
| 9,373,948 B2 * | 6/2016 | Baker | H02B 1/052 |
| 9,386,718 B2 * | 7/2016 | Kusumi | H05K 7/14 |
| 9,743,538 B2 * | 8/2017 | Mickmann | H02B 1/0523 |
| 9,752,603 B2 * | 9/2017 | Shi | F16B 2/185 |
| 2007/0008708 A1 * | 1/2007 | Hanning | H02B 1/052 361/801 |
| 2008/0108248 A1 * | 5/2008 | Lim | H02B 1/052 439/532 |
| 2009/0125156 A1 | 5/2009 | Killian et al. | |
| 2014/0017917 A1 | 1/2014 | Molnar | |

OTHER PUBLICATIONS

Beckhoff Fieldus Components—Documentation for Terminal Modules (KM10X4 / KM10X8), Ver. 2.0.0 dated Mar. 21, 2012 (3 pages).

X20 System User's Manual (B & R), Ver. 3.00 dated Oct. 2014, pp. 62, 2326-2328.

\* cited by examiner

DIN LATCH MECHANISM

FIELD

The present development relates to an improved latch for an electronics module, and to an electronics module including the improved latch. In one application, the electronics module is an input/output (i/o) module or a controller module or the like provided as part of an industrial automation control system, but other types of electronics modules are contemplated and are within the scope of the present development. In one application, the latch is particularly adapted to selectively and releasably mate with a 35 mm×7.5 mm top hat DIN rail, i.e., a rail provided in accordance with EN 50022, BS 5584, DIN 46277-3 (referred to herein as a "DIN rail"), but the latch can be alternatively configured to mate with any other rail or structure including first and second edges or flanges to be engaged by the latch.

BACKGROUND INFORMATION

The subject matter disclosed herein relates to Industrial automation and other types of electronics modules often including a latch or latch system for selectively and releasably connecting the electronics module to an associated mounting structure such as a DIN rail. While known latches of this type are generally suitable and effective, a need has been identified for a new and improved latch assembly or latching system that is more convenient and effective than known latch assemblies.

SUMMARY

In accordance with one aspect of the present development, an electronics module comprises a housing including a rear face comprising a recess adapted to receive an associated mounting rail, said recess having first and second opposite edges, a latch assembly connected to said housing and adapted for selectively releasably securing said housing to an associated mounting rail located in said recess, said latch assembly having a first latch portion movably connected to said housing and having a locking tab adapted to capture a first associated DIN rail flange in said recess, a second latch portion movably connected to said housing adjacent said first latch portion and having a second locking tab adapted to capture a second associated DIN rail flange in said recess; said first and second latch portions movable relative to each other to and between: (i) a latched configuration where said first and second latch portions are located in respective latched positions in which said first and second locking tabs project respectively beyond said first and second opposite edges of said recess and partially obstruct said recess; and (ii) an unlatched configuration where said first and second latch portions are located in respective unlatched positions in which said first and second locking tabs are spaced farther apart from each other as compared to the latched configuration, said first and second latch portions coupled together for opposite reciprocating movement between said latched and unlatched positions.

In one or more exemplary embodiments a biasing member for biasing said first and second latch portions towards the latched position can be provided. The biasing member can include a compression spring extending between the housing and only one of the first or second latch portions, for example. The second latch portion can have an actuation portion located external to said housing and adapted to be manually depressed to move said second latch portion from its latched position toward its unlatched position and, consequently, move said first latch portion in an opposite direction from its latched position towards its unlatched position. The second latch portion can be selectively manually movable from its latched position toward its unlatched position such that said first latch portion slides relative to said second latch portion in an opposing direction, said housing can further include a lock lever adapted to engage and retain the second latch portion in the unlatched position. The lock lever can be selectively manually deflectable to disengage the second latch portion to allow return of the first and second latch portions to the latch position. The lock lever can include at least one projection including a ramp surface, said ramp surface can be configured to engage the second latch portion during movement thereof to deflect the lock lever. The protrusion can be adapted to be received in an opening in the second latch portion, said opening aligning with said protrusion when the first and second latch portions are in the unlatched position. A cam member can be pivotally supported by the housing at a midpoint thereof, respective end portions of the cam member engaged with a respective one of the first and second latch portions thereby coupling same for reciprocating relative movement.

In accordance with another aspect, an electronics module comprises a housing having a recess adapted to receive an associated mounting rail, said recess having first and second opposite edges, and a latch assembly adapted to selectively secure the housing to the mounting rail. The latch assembly includes first and second reciprocating latch portions mounted in the housing and adapted to engage respective first and second opposite edges of the associated mounting rail, each of the latch portions including a locking tab configured to extend into the recess to engage the associated mounting rail, said locking tabs movable away from each other from a latched position to an unlatched position, said first and second latch portions being coupled together for reciprocating motion, at least one of said latch portions including an actuator portion extending from the housing for manual actuation of the latch assembly between the latch and unlatched positions, the actuator portion adapted to engage structure of the housing when the locking tabs are in the unlatched position to restrict movement of the latch assembly from the unlatched position.

In one or more embodiments a biasing member for biasing said first and second latch portions towards the latched position can be provided. The biasing member can include a compression spring extending between the housing and only one of the first or second latch portions, for example. The second latch portion can include an actuation portion located external to said housing and adapted to be manually engaged to move said second latch portion in said second direction from its latched position toward its unlatched position and, consequently, move said first latch portion in an opposite direction from its latched position towards its unlatched position. The second latch portion can be selectively manually movable from its latched position toward its unlatched position such that said first latch portion slides relative to said second latch portion in an opposing direction, said housing further including a lock lever adapted to engage and retain the second latch portion in the unlatched position. The lock lever can be cantilevered and selectively manually deflectable to disengage the second latch portion to allow return of the first and second latch portions to the latched position. The lock lever can include at least one projection including a ramp surface, said ramp surface configured to engage the second latch portion during movement thereof to deflect the lock lever. The protrusion can be adapted to be received in an opening in the second latch portion, said opening aligning with said protrusion when the first and second latch portions are in the unlatched position. The lock lever can be deflectable in a direction perpendicular to a direction of the movement of the second latch portion. A cam member can be pivotally supported by the housing at a central location, respective end portions of the cam member engaged with a respective one of the first and second latch portions thereby coupling same for reciprocating relative movement. The second latch portion can be elongate and coextensive with a width of the recess in the housing, said housing further comprising a pair of support wings for supporting a distal end of the second latch portion opposite the actuator portion.

DETAILED DESCRIPTION

Figure 1:
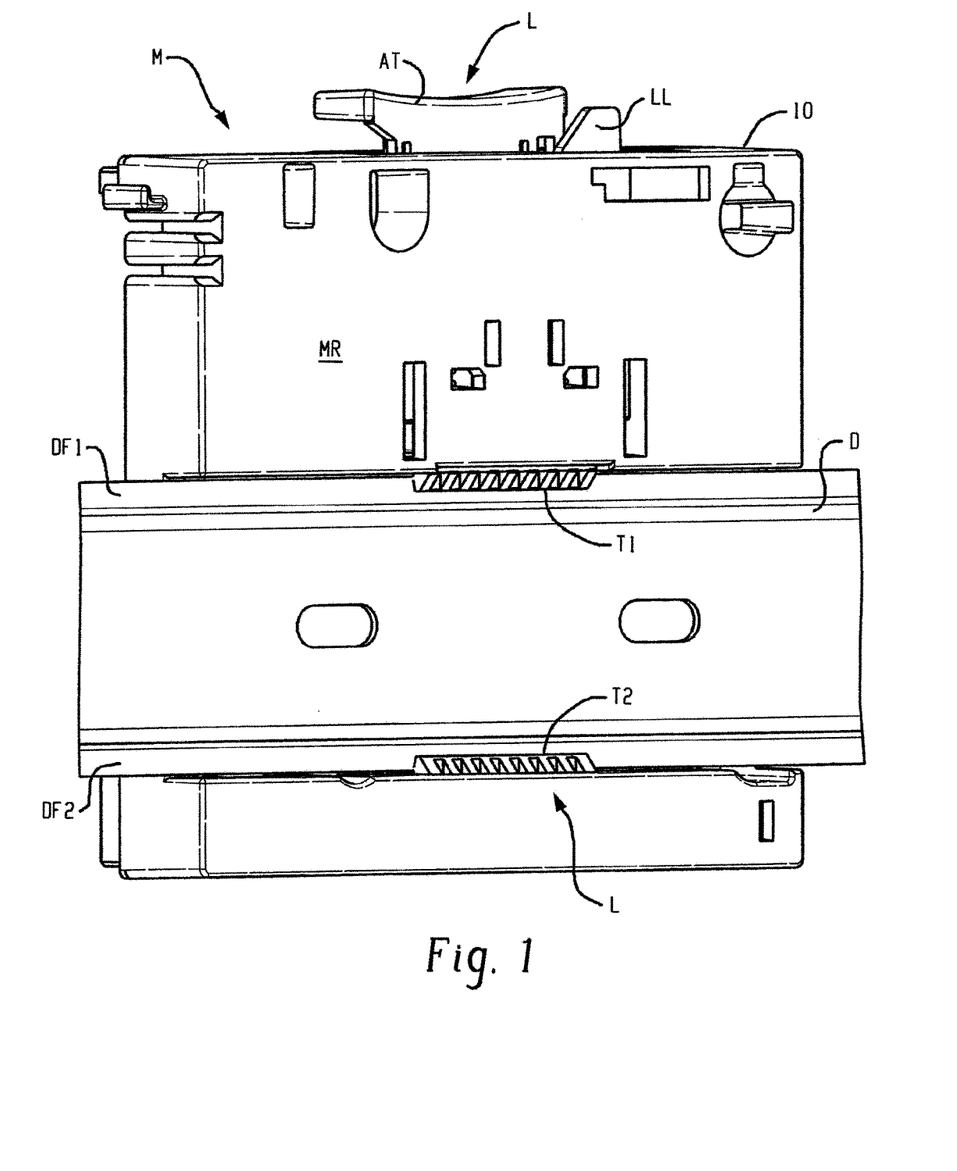
FIG. 1 is a rear isometric view of an electronics module including a latch system in accordance with an exemplary embodiment of the present development operatively connected to an associate DIN rail.
Figure 2:
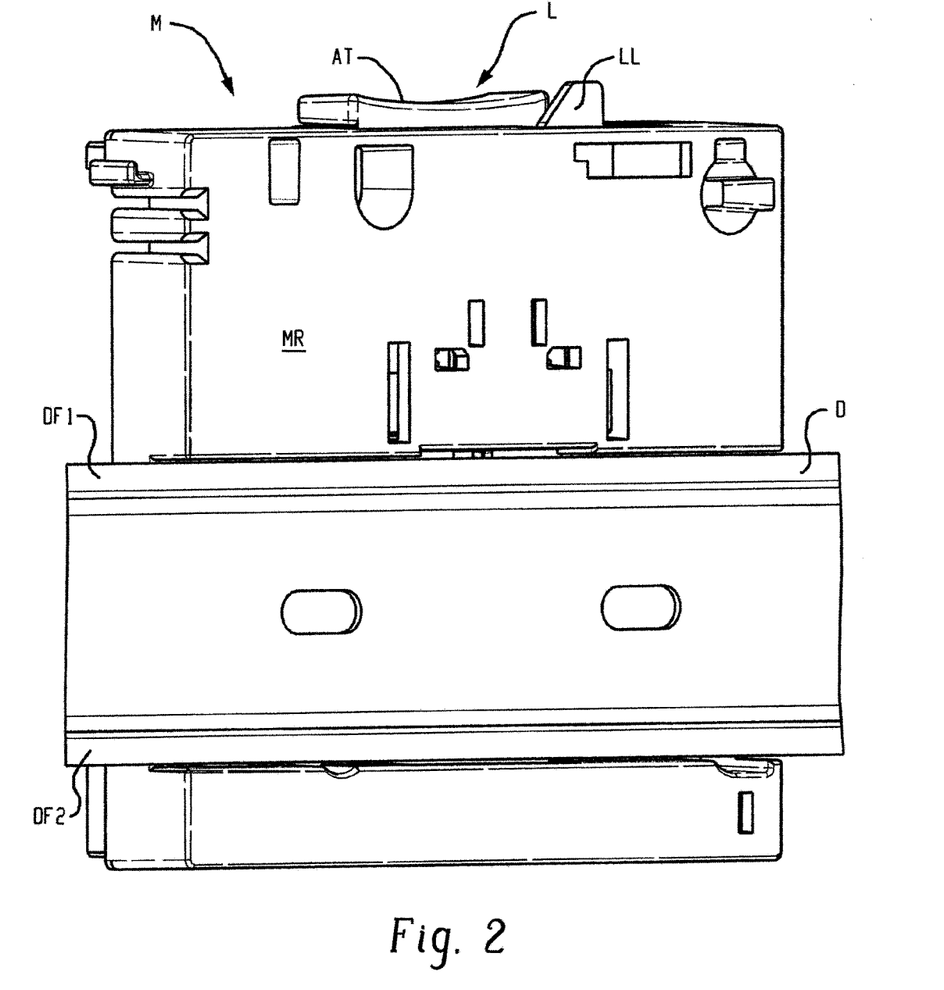
FIG. 2 is a rear isometric view of the electronics module of FIG. 1, showing the module adjacent the associated DIN rail with the latch system disengated therefrom.

FIGS. 1 and 2 are rear isometric views of an electronics module M including a latch system L in accordance with an embodiment of the present development. The illustrated electronics module M is an input/output module of an industrial automation system, but the module can be any other type of electronics modules such as an adapter module, controller module, or another type of module of an industrial automation system, or an electronics module not related to an industrial automation system.

FIG. 1 illustrates the electronics module M operatively connected to an associated DIN rail D. To this end, first and second locking tabs T1 and T2 are engaged with opposite flange portions of the DIN rail D. FIG. 2 illustrates the first and second locking tabs T1 and T2 in a disengaged position (e.g., withdrawn from engagement with DIN rail D) for permitting removal of the electronics module M from the DIN rail D. In general, it should be appreciated that movement of the first and second locking tabs T1 and T2 between an engaged position and a disengaged position is effected through depression of an actuator tab AT. Actuator tab AT and the first and second locking tabs T1 and T2 are components of a latching system L that, as will be described herein, is operative to engage and disengage the first and second locking tabs T1 and T2 as well as latch in the first and second locking tabs T1 and T2 in a disengaged position to permit easy installation/removal of the electronics module M.

Figure 3:
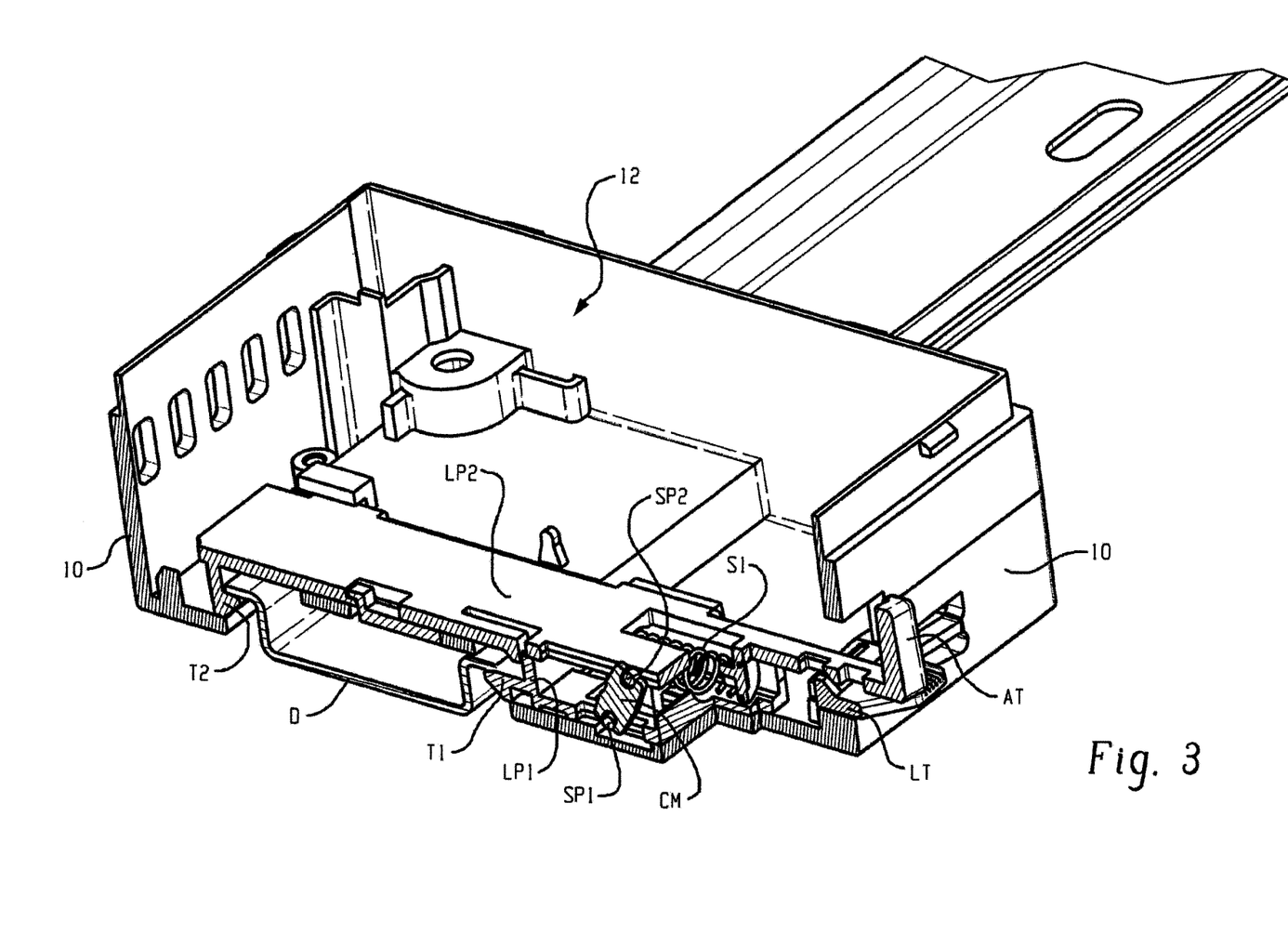
FIG. 3 is a simplified side section view of the module and DIN rail of FIG. 1, showing the latch system in its latched or locked configuration.
Figure 4:
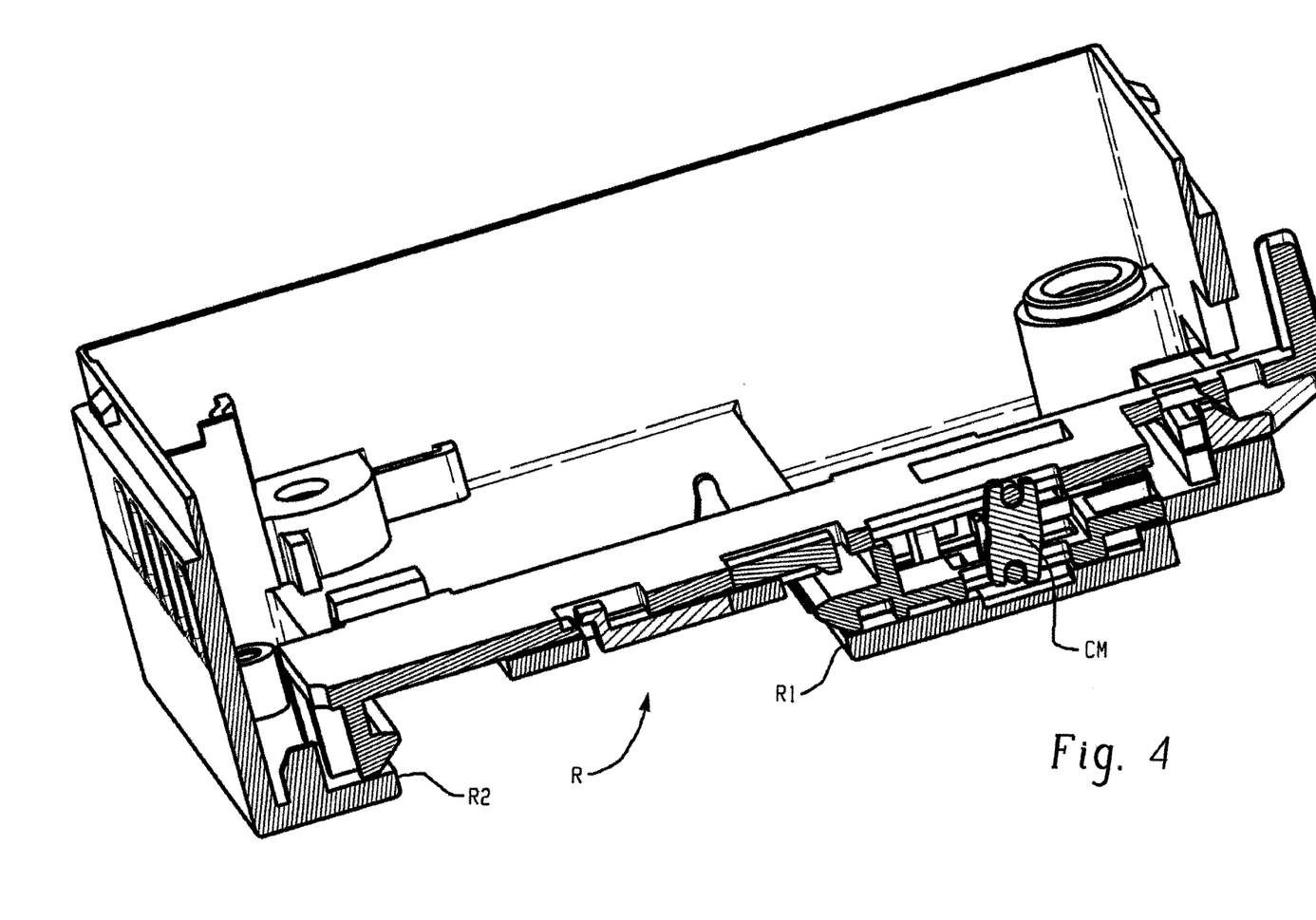
FIG. 4 is similar to FIG. 3, but shows the latch system in a partially unlatched or unlocked configuration.
Figure 5:
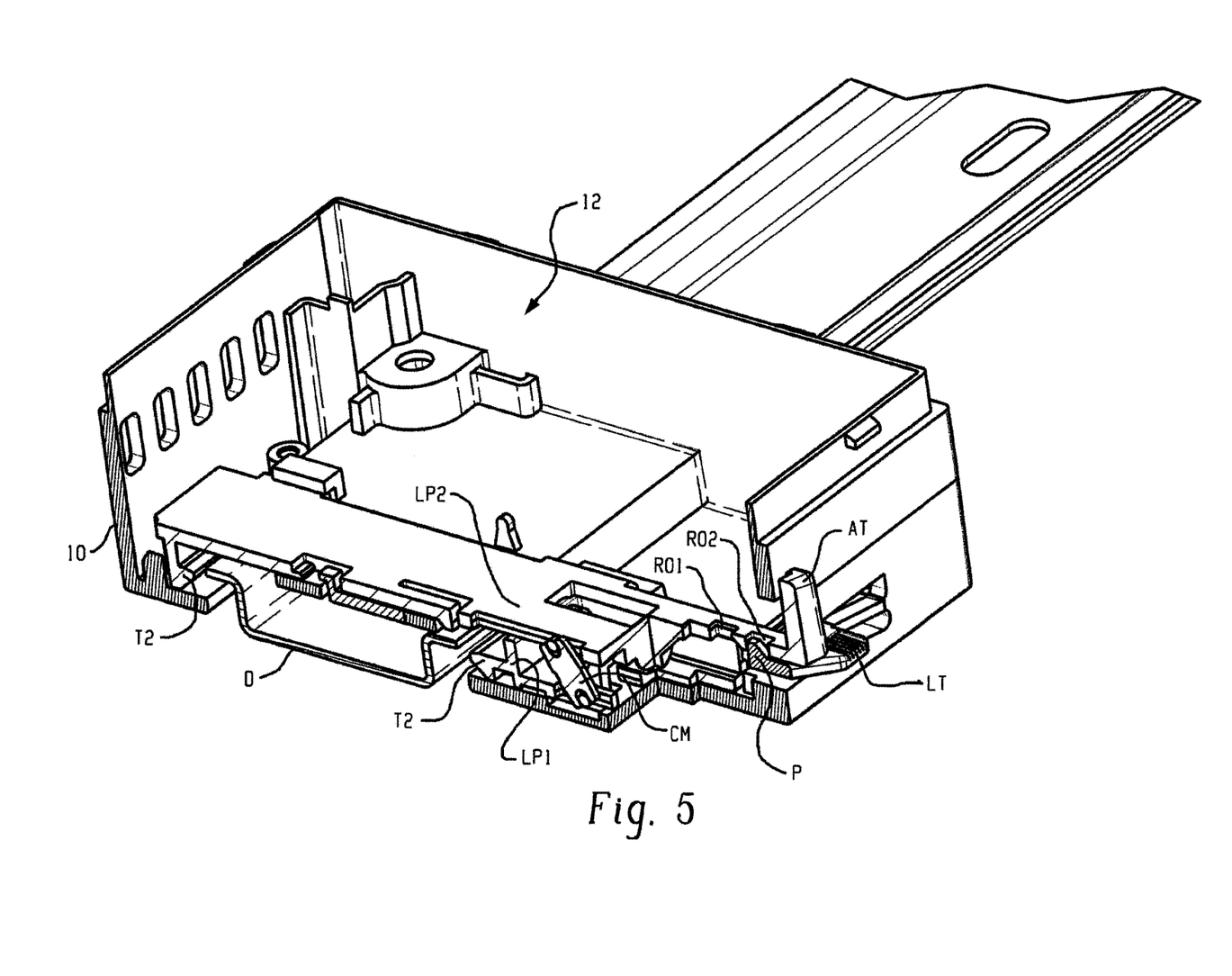
FIG. 5 is similar to FIGS. 3 and 4, but shows the latch system in its unlatched or unlocked configuration.

FIG. 3 is a cross-sectional view of the module M and DIN rail D, showing the latch system L in its latched or locked configuration, while FIGS. 4 and 5 show the latch system L in an intermediate position between the locked configuration and unlocked configuration and an unlocked configuration, respectively.

Referring to all of FIGS. 1-4, the electronics module M comprises a one-piece or multi-piece molded polymeric or metallic (e.g. formed, cast and/or extruded aluminum or other metal) housing 10 that defines an interior space 12 that receives and retains one or more electronic components such as one or more printed circuit boards PCB comprising a microprocessor P such as an ASIC or general purpose microprocessor and/or other electronic circuitry adapted and programmed to perform a desired electronic function. It is often desirable to secure the module M to an associated support structure such as a DIN rail or other support structure in an operative position as shown in FIG. 3 and to selectively disengage and separate the module M from the DIN rail or other support structure, and the latch system L is provided for such purposes. To simplify the description, the associated support structure will be described herein as the illustrated DIN rail D, which comprises first and second longitudinally extending edges or flanges DF1,DF2 (FIGS. 1 and 2), but other support structures are contemplated and are within the scope of the present development.

With continuing reference to FIGS. 1-4, the housing 10 of the module M comprises or defines a recess R in a rear face MR thereof, and the recess R is dimensioned to closely receive the DIN rail D therein as shown, with the first and second DIN rail flanges DF1,DF2 located respectively adjacent first (lower) and second (upper) opposite edges R1,R2 of the recess R, with minimal clearance space between the DIN rail edges DF1,DF2 and the recess edges R1,R2. The recess R is open on its opposite lateral left and right sides so that the DIN rail D extends through the recess.

The latch system L of the module M comprises a latch assembly having first and second latch members or latch portions LP1,LP2 that selectively engage the first and second DIN rail flanges DF1,DF2, respectively, for capturing and retaining the DIN rail flanges in the recess R for operative connection of the module M to the DIN rail D.

Referring now particularly to FIGS. 3-5, the first and second latch portions LP1,LP2 can be seen, along with other components of the latch assembly including a cam member CM adapted to couple the first and second latch portions LP1,LP2 together for opposite reciprocating movement. Cam member CM includes pivot arms PA1, PA2 supported in a cradle C of the housing 10 (see, for example, FIG. 8) Respective teeth T of the cam member CM are coupled to shaft portions SP1 and SP2 of each of the first and second latch portions LP1,LP2. As will be described in more detail below, movement of second latch portion LP2 in a first direction causes movement of the first latch portion LP2 in an opposite direction, and vice versa. In this manner, it should be appreciated that depression of the actuator tab AT translates second latch portion LP2 such that second locking tab T2 is withdrawn from recess R (and/or engagement with DIN rail D) and corresponding opposite movement of first latch portion LP1 and withdrawal of first locking tab T1 from recess R (and/or engagement with DIN rail D).

Actuator tab AT further includes first and second engagement elements in the form of openings or recesses R01/R02 for engaging with a protrusion P of a lock lever LL. Lock lever LL in the illustrated embodiment is found integrally with housing 10. Protrusion P includes a ramped surface for facilitating movement of second latch portion LP2 during depression of the actuator tab AT via resilient deflection of the lock lever LL and or actuator tab AT itself. Thus, beginning in the position shown in FIG. 3, as the second latch portion LP2 is depressed, the ramp surface of projection P engages a corresponding ramp surface of second latch portion LP2. Further depression of the actuator tab AT results in a camming action which deflects the lock lever LL downwardly (as shown in FIG. 4) such that protrusion P clears recess R01. When the actuator tab AT is further depressed to the position shown in FIG. 5, the lock lever returns to its original position such that protrusion P is received in recess R02 thereby preventing the actuator tab AT from returning to the position of FIG. 3 unless and until the lock lever is manually depressed, as will be described below.

It should be appreciated that a biasing mechanism biases second latch portion LP2 against depression of the actuator tab AT such that the biasing force tends to return the latch system L to a latched configuration. Thus, lock lever LL serves to maintain the latch system in an unlatched configuration (with actuator tab AT depressed) until lock lever LL is manually triggered to allow the biasing mechanism to return the latch system L to the latched configuration.

As will be described below, the biasing mechanism of the illustrated exemplary embodiment is in the form of a pair of compression springs S1/S2 installed in a manner so as to bias the second latch portion LP2 in the manner described in the previous paragraph.

Figure 6:
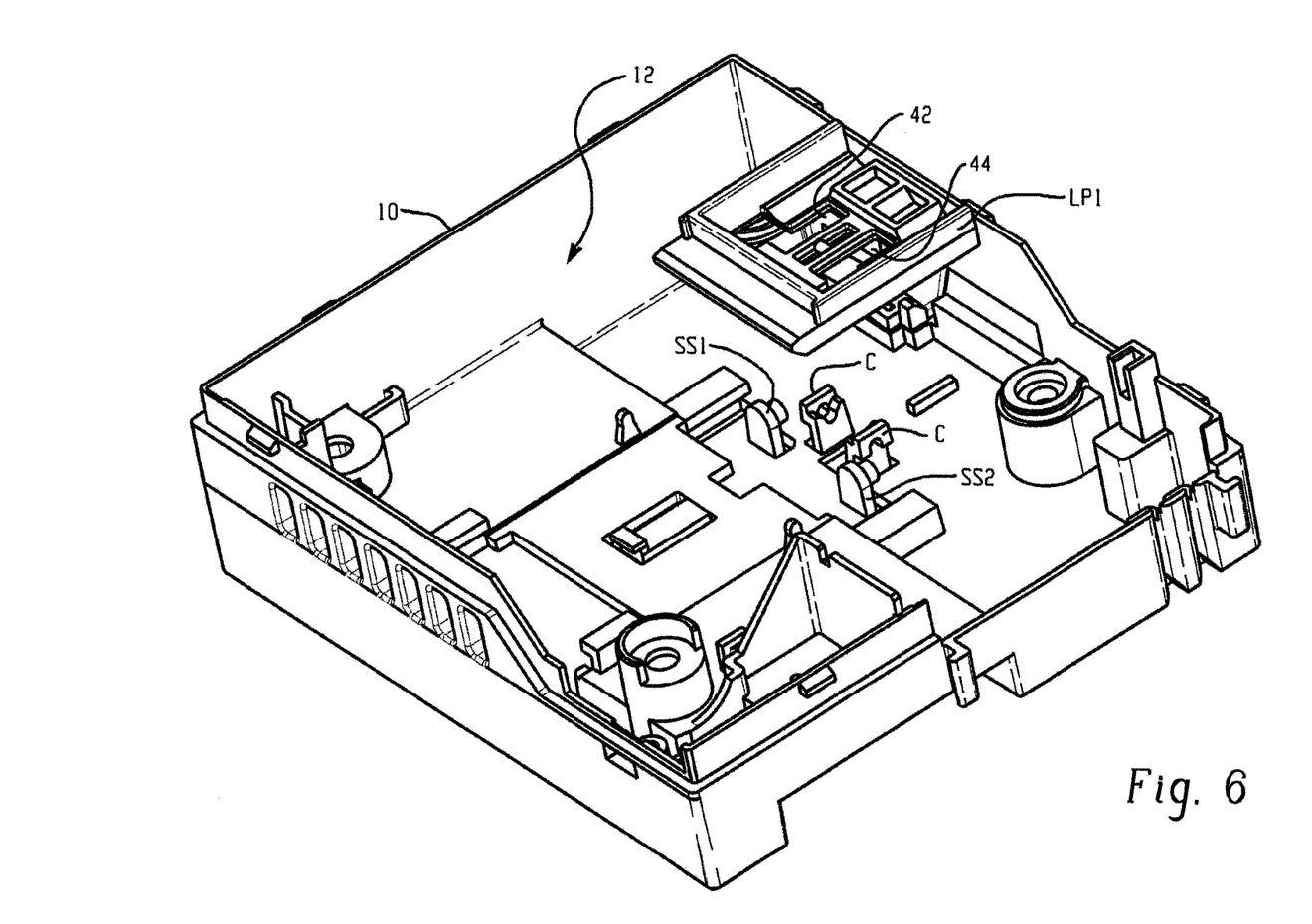
FIGS. 6-9 are perspective views illustrating the module in stages of assembly.
Figure 7:
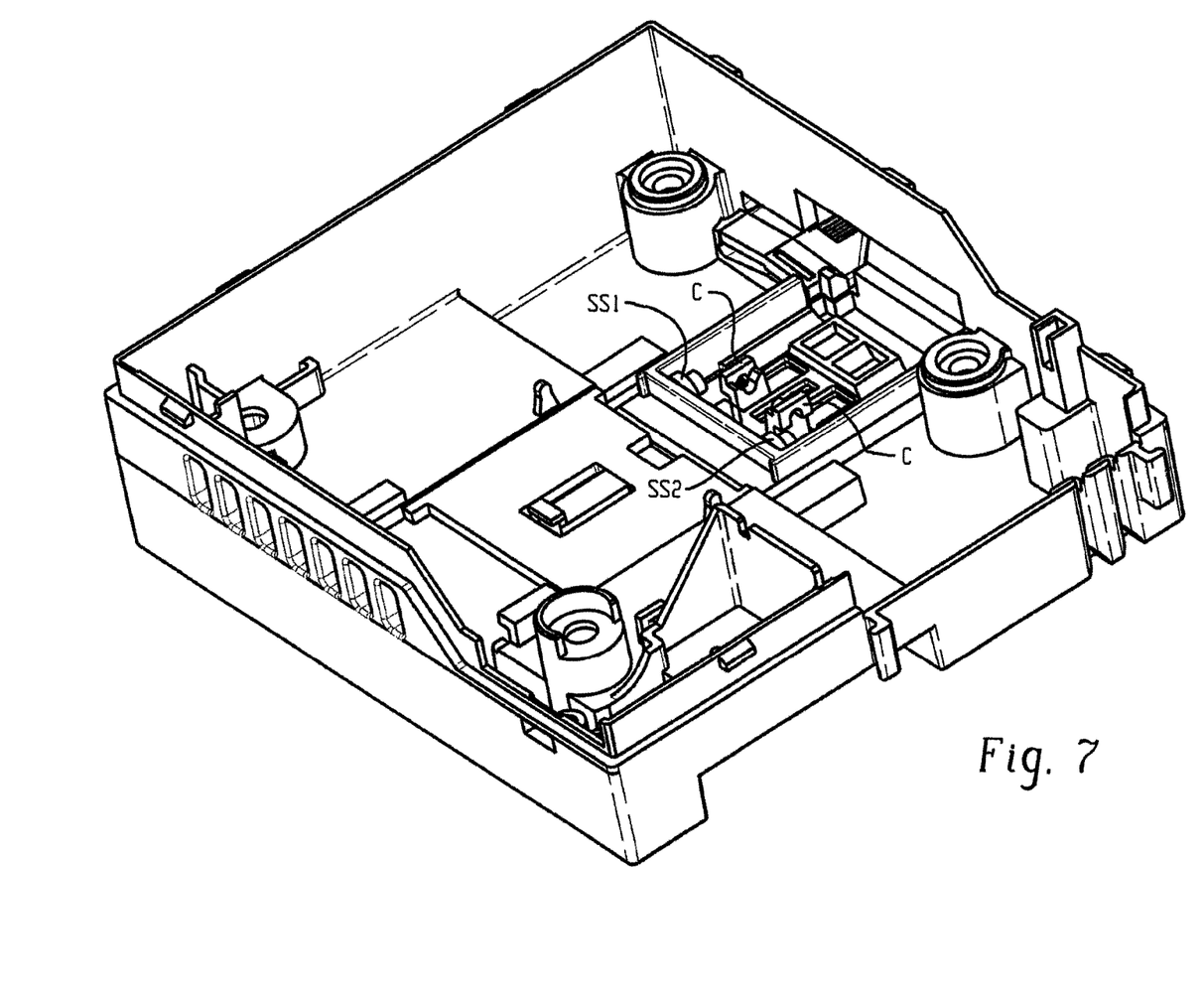

With reference to FIGS. 6-13, the assembly and further details of the latch system will be described. In FIG. 6, the housing 10 is shown with latch portion LP1 about to be positioned within the interior space 12. First latch portion LP1 is generally of a flat rectangular shape and includes first locking tab T1. First and second slots 42/44 in the first latch portion LP1 are adapted to receive the cradle C of the housing 10 as well as spring supports SS1 and SS2 of the housing 10, as shown in FIG. 7. The first and second slots 42/44 allow latch portion LP1 to slide relative to housing 12 between the engaged/disengaged positions during operation of the latch system L. Spring supports SS1/SS2 provide support for springs S1 and S2, respectively, and as will be shown, facilitate positioning and retention of the springs S1 and S2 between the housing 10 and the second latch portion LP2 to bias the same towards the latched configuration.

Figure 8:
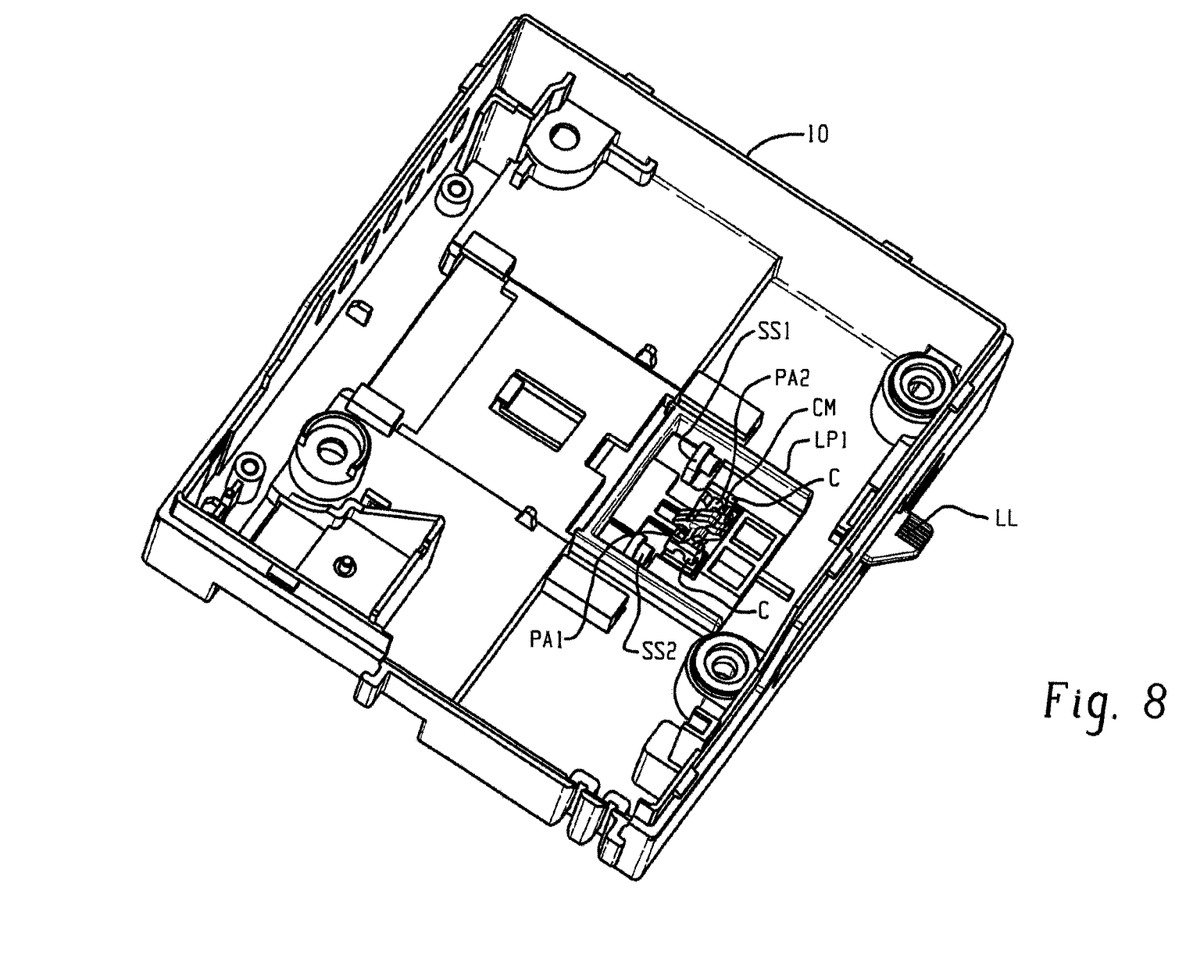

Turning to FIG. 8, the cam member CM is supported at a central portion thereof on cradle C of the housing 10 for pivoting movement. Cam member CM includes a first tooth 46 for engaging the shaft portion SP1 of the first latch portion LP1 and a second tooth 48 for engaging the shaft portion SP2 of the second latch portion LP2 in a similar manner. During assembly, the first latch portion LP1 is positioned in the engaged configuration such that tooth 48 of cam member CM is angled to receive shaft portion SP2 of the second latch portion LP2 as the second latch portion LP2 is advanced into position within the housing 10.

Figure 9:
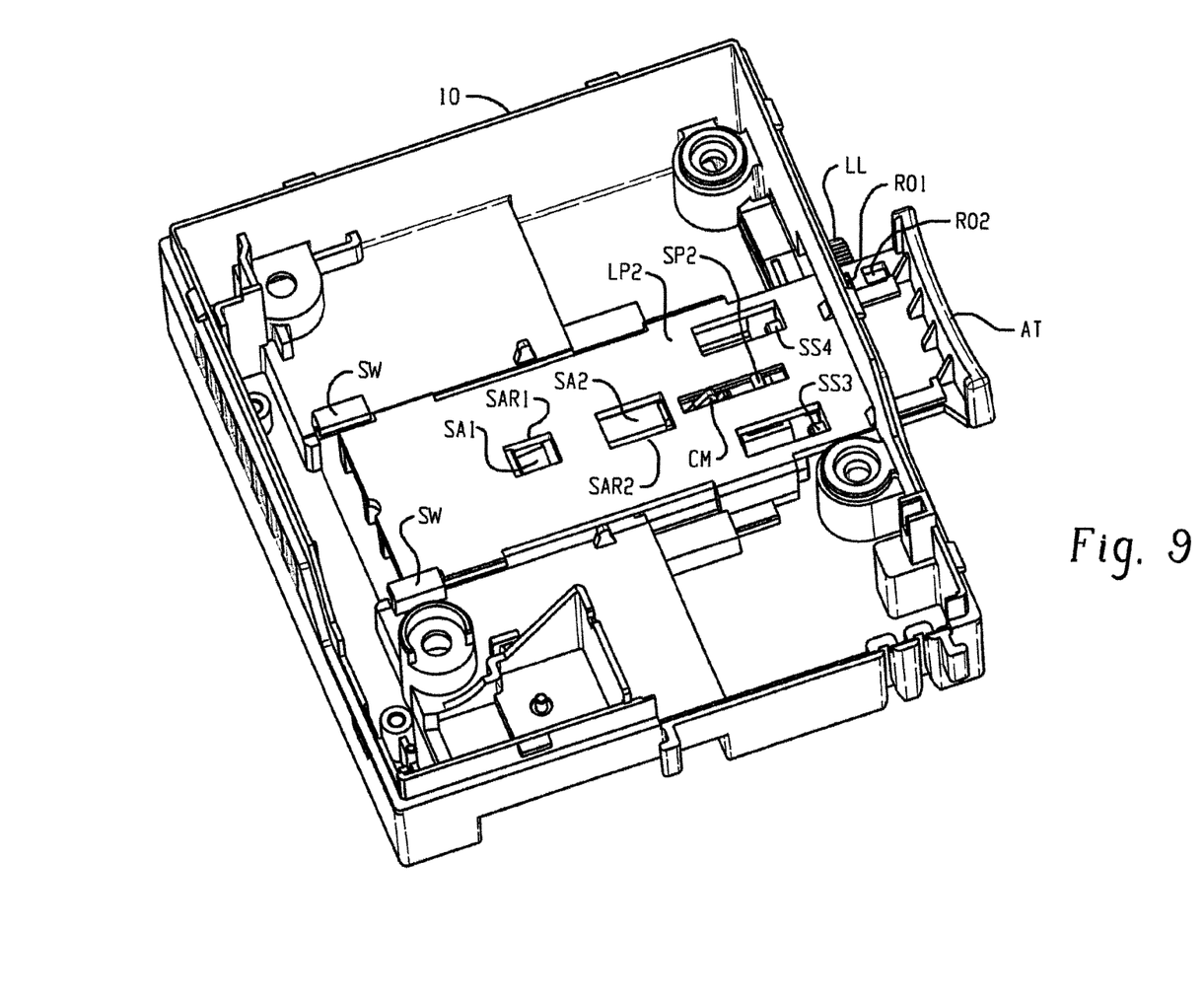
Figure 10:
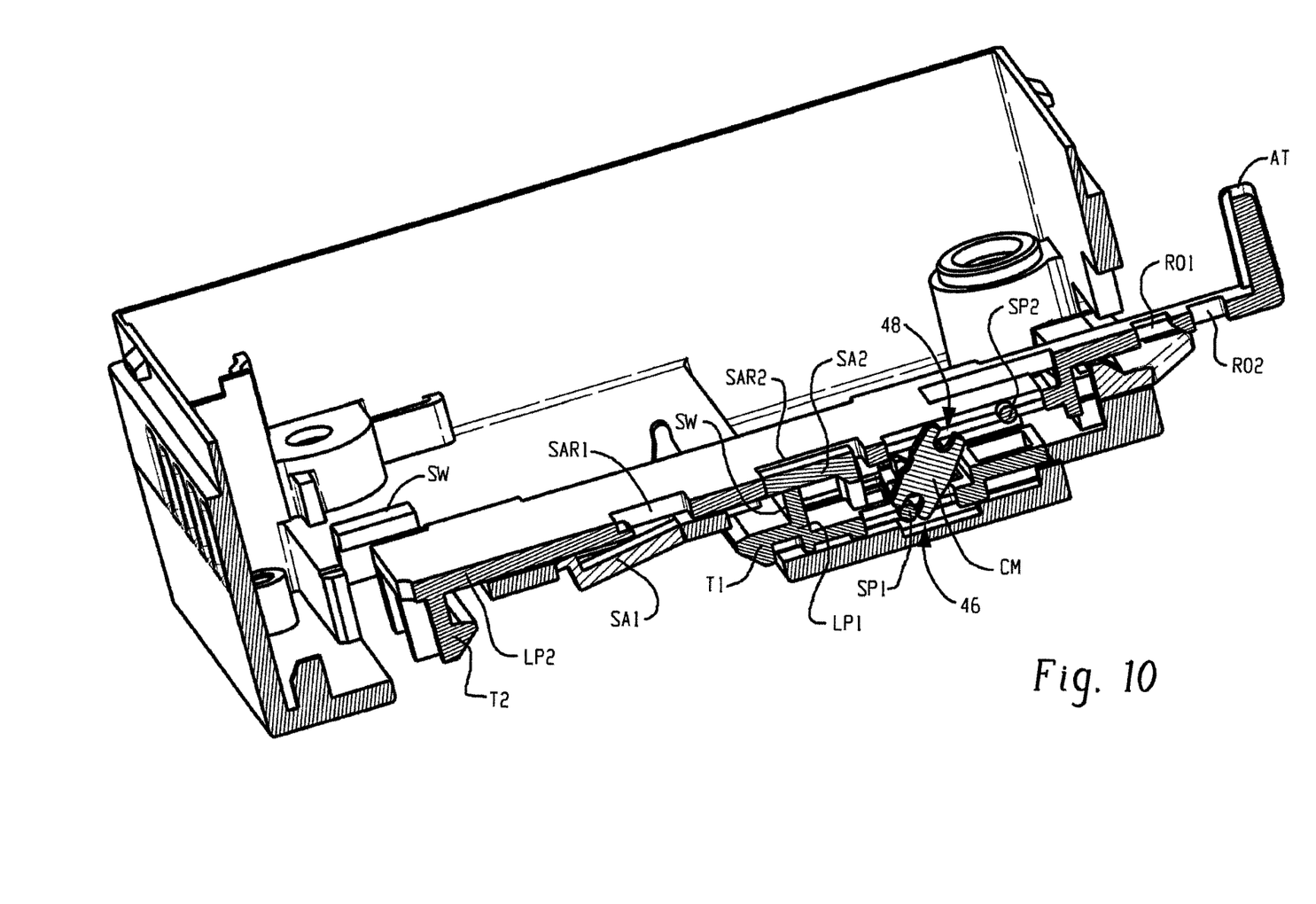
FIGS. 10-12 are cross-sectional views illustrating instruction of latch numbers into housing, and movement of the latch system to the unlocked or unlatched configuration.
Figure 11:
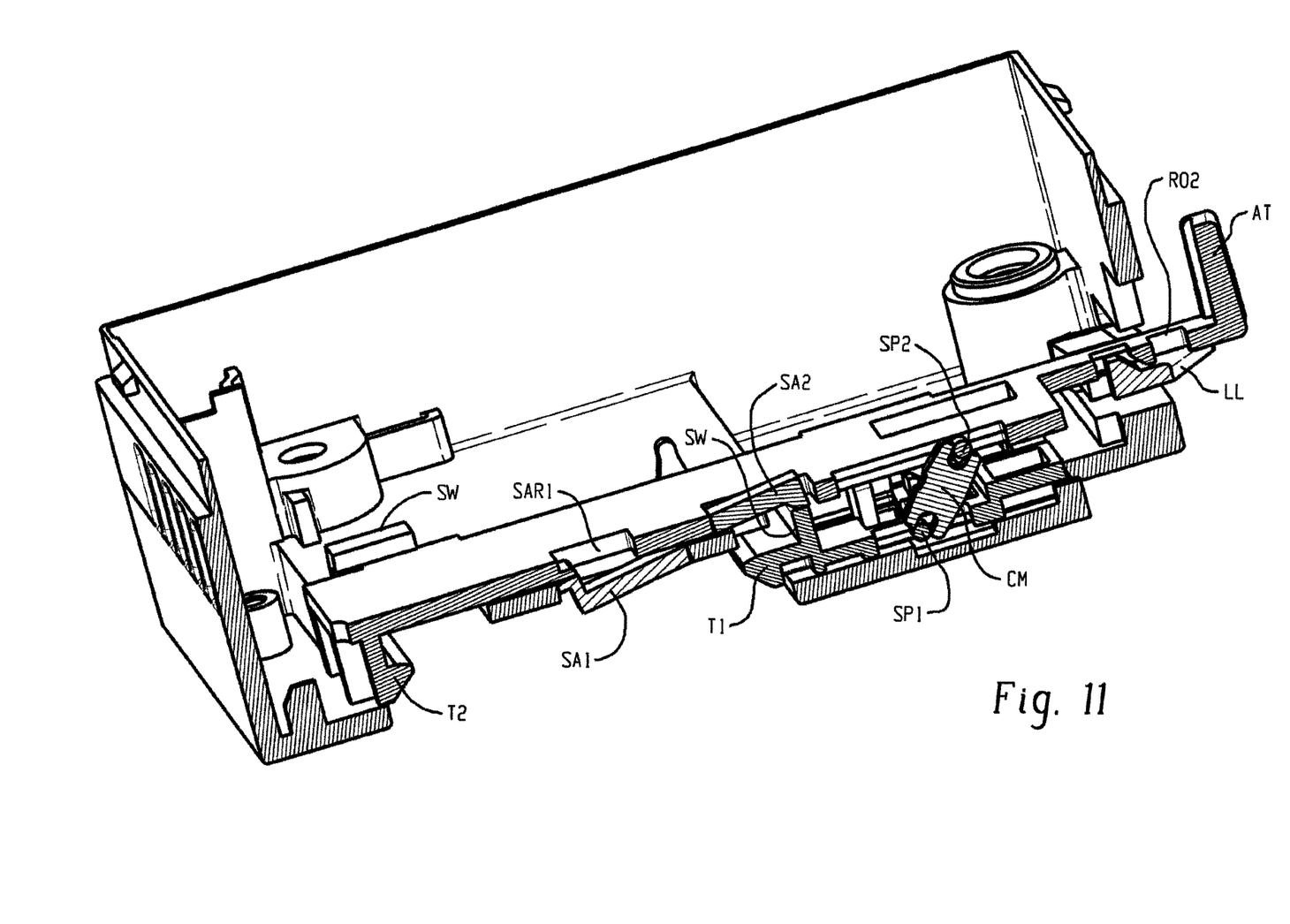
Figure 12:
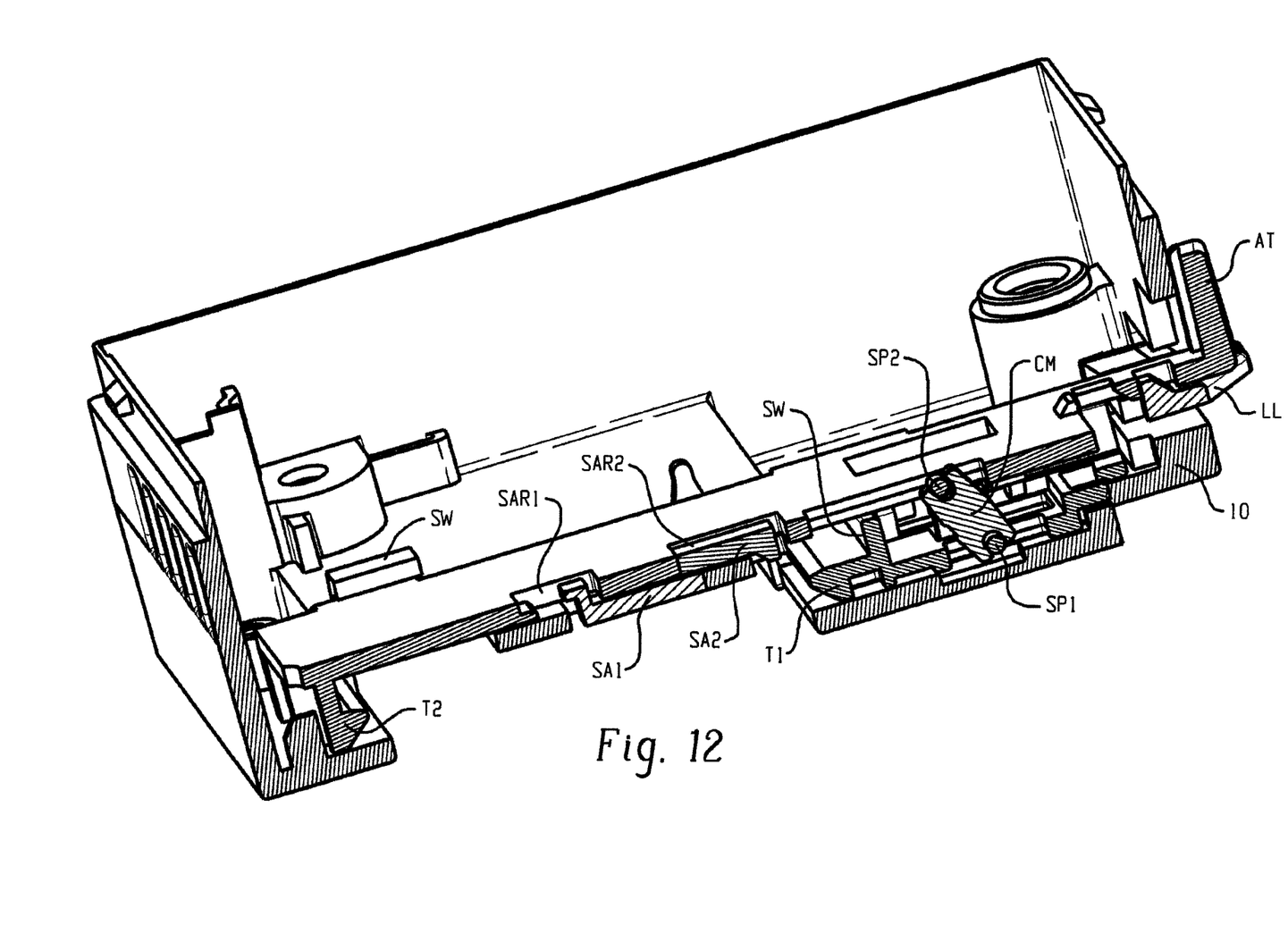

As shown in FIGS. 9-11, the second latch portion LP2 is illustrated partially inserted into the housing 10 such that the shaft portion SP2 is approaching engagement with tooth 48 of the cam member CM. As the second latch portion LP2 is advanced into position, first and second stop arms SA1 and SA2 are adapted to flex out of position to accommodate positioning of the second latch portion LP2. As will be appreciated, first stop arm SA1 is provided on the housing 10 and may be formed integrally therewith. After initially deflecting, first stop arm SA1 is adapted to snap into a recess or opening SAR1 in the second latch portion LP2. Interference between the surfaces of the second latch portion LP2 defining the opening SAR1 limit the extent of movement of the second latch portion LP2 relative to the housing 10.

Meanwhile, second stop arm SA2 provided on the second latch portion LP2 is also adapted to flex during installation of the second latch portion LP2. Second stop arm SA2 is configured to flex to clear stop wall SW of the first latch portion LP1 and return into position so as to abut stop wall SW when the latch system is in the latched configuration. That is, second stop arm SA2 abuts stop wall SW to limit relative movement between the first and second latch portions LP1/LP2 when the latch system L is returning to the latched configuration. It should be appreciated that the second latch portion LP2 is secured within the housing for sliding movement relative thereto by a plurality of support wings SU.

Figure 13:
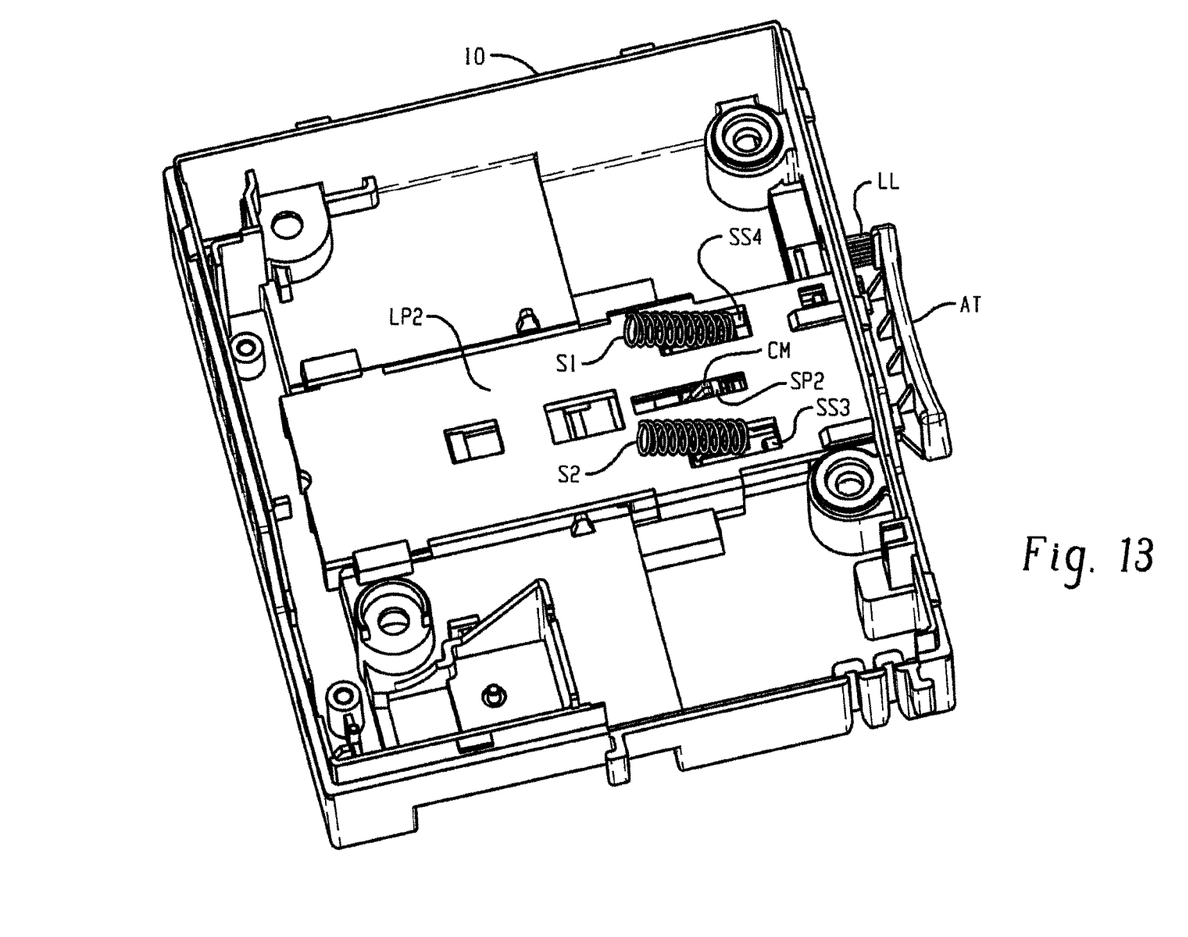
FIG. 13 is a perspective view of the module illustrating installation of biasing elements.

Turing to FIG. 13, once the second latch portion LP2 is installed in the system, springs S1 and S2 can be inserted into position via spring windows in the second latch portion LP2. Springs S1 and S2, as noted previously are configured to bias the second latch portion LP2 (and consequently the first latch portion LP1) towards a latched position. To this end, the springs S1 and S2 are inserted such that first ends thereof are supported on spring supports SS1/SS2 of the housing while second ends thereof engage corresponding spring supports SS3/SS4 of the second latch portions LP2.

The present development thus provides an electronics module including a latch system that allows for one-handed operation/single-point actuation, does not require a screwdriver or other tool to operate, utilizes linear movement for latching rather than pivoting or rotational movement, provides positive tactile feedback when moving between its latched and unlatched configurations, is able to be locked in an open or unlatched configuration, and that is more convenient and effective than known latch assemblies.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An electronics module mountable to an associated mounting rail comprising:
   a housing including a rear face having a recess adapted to receive the associated mounting rail, said recess having first and second opposite edges;
   a latch assembly connected to said housing and adapted for selectively releasably securing said housing to the associated mounting rail located in said recess, said latch assembly including:
      a first latch portion supported for sliding movement by said housing and comprising a locking tab adapted to capture a first associated DIN rail flange in said recess;
      a second latch portion supported for sliding movement by said housing adjacent said first latch portion and comprising a second locking tab adapted to capture a second associated DIN rail flange in said recess;
      said first and second latch portions movable relative to each other to and between: (i) a latched configuration where said first and second latch portions are located in respective latched positions in which said first and second locking tabs project respectively beyond said first and second opposite edges of said recess and partially obstruct said recess; and (ii) an unlatched configuration where said first and second latch portions are located in respective unlatched positions in which said first and second locking tabs are spaced farther apart from each other as compared to the latched configuration;

said first and second latch portions coupled together for opposite reciprocating movement between said latched and unlatched positions along a common axis;

wherein said second latch portion includes an actuation portion located external to said housing and adapted to be manually depressed to move said second latch portion in said second direction from its latched position toward its unlatched position and, consequently, move said first latch portion in an opposite direction from its latched position towards its unlatched position;

wherein said second latch portion is selectively manually movable from its latched position toward its unlatched position such that said first latch portion slides relative to said second latch portion in an opposing direction;

wherein said housing further including a lock lever adapted to engage the actuation portion of the second latch portion to retain the second latch portion in the unlatched position; and wherein said lock lever is selectively manually deflectable to disengage the actuation portion of the second latch portion to allow return of the first and second latch portions to the latched position.

2. The electronics module as set forth in claim 1, further comprising a biasing member for biasing said first and second latch portions towards the latched position.

3. The electronics module as set forth in claim 2, wherein the biasing member includes a compression spring extending between the housing and only one of the first or second latch portions.

4. The electronics module as set forth in claim 1, wherein the lock lever includes at least one projection including a ramp surface, said ramp surface configured to engage the second latch portion during movement thereof to deflect the lock lever, and wherein the at least one projection is adapted to be received in an opening in the second latch portion, said opening aligning with said at least one projection when the first and second latch portions are in the unlatched position.

5. The electronics module as set forth in claim 1, further comprising a first stop arm extending from the housing for maintaining the second latch portion in the latched configuration, and a second stop arm extending from the second latch portion for maintaining the first latch portion in the latched configuration.

6. The electronics module as set forth in claim 1, further comprising a cam member pivotally supported by the housing at a central portion thereof, respective end portions of the cam member engaged with a respective one of the first and second latch portions thereby coupling same for reciprocating relative movement.

7. An electronics module comprising:
a housing having a recess adapted to receive an associated mounting rail, said recess having first and second opposite edges; and
a latch assembly adapted to selectively secure the housing to the associated mounting rail;
said latch assembly including first and second reciprocating latch portions each supported for sliding movement along a common axis by the housing and adapted to engage respective first and second opposite edges of the associated mounting rail, each of the latch portions including a locking tab configured to extend into the recess to engage the associated mounting rail, said locking tabs movable away from each other from a latched position to an unlatched position, said first and second latch portions being coupled together for opposite reciprocating motion, at least one of said latch portions including an actuator portion extending from the housing for manual actuation of the latch assembly between the latch and unlatched positions, the actuator portion adapted to engage a structure of the housing when the locking tabs are in the unlatched position to restrict movement of the latch assembly from the unlatched position, wherein the structure of the housing is selectively manually deflectable to disengage the actuator portion to allow return of the first and second latch portions to the latched position.

8. The electronics module as set forth in claim 7, further comprising a biasing member for biasing said first and second latch portions towards the latched position.

9. The electronics module as set forth in claim 8, wherein the biasing member includes a compression spring extending between the housing and at least one of the first or second latch portions.

10. The electronics module as set forth in claim 7, wherein:
said second latch portion includes the actuation portion located external to said housing and adapted to be manually engaged to move said second latch portion in said second direction from its latched position toward its unlatched position and, consequently, move said first latch portion in an opposite direction from its latched position towards its unlatched position.

11. The electronics module as set forth in claim 10, wherein said second latch portion is selectively manually movable from its latched position toward its unlatched position such that said first latch portion slides relative to said second latch portion in an opposing direction, said housing further including a lock lever adapted to engage and retain the second latch portion in the unlatched position.

12. The electronics module as set forth in claim 11, wherein said lock lever is cantilevered and selectively manually deflectable to disengage the second latch portion to allow return of the first and second latch portions to the latched position.

13. The electronics module as set forth in claim 12, wherein the lock lever includes at least one projection including a ramp surface, said ramp surface configured to engage the second latch portion during movement thereof to deflect the lock lever, and wherein the at least one projection is adapted to be received in an opening in the second latch portion, said opening aligning with said least one projection when the first and second latch portions are in the unlatched position.

14. The electronics module of claim 7, further comprising a first stop arm extending from the housing for maintaining the second latch portion in the latched configuration, and a second stop arm extending from the second latch portion for maintaining the first latch portion in the latched configuration.

15. The electronics module as set forth in claim 13, wherein said lock lever is deflectable in a direction perpendicular to a direction of the movement of the second latch portion.

16. The electronics module as set forth in claim 7, further comprising a cam member pivotally supported by the housing at a midpoint thereof, respective end portions of the cam member engaged with a respective one of the first and second latch portions thereby coupling same for reciprocating relative movement.

17. The electronics module as set forth in claim 7, wherein the second latch portion is elongate and coextensive with a width of the recess in the housing, said housing further comprising a pair of support wings for supporting a distal end of the second latch portion opposite the actuator portion.

\* \* \* \* \*